United States Patent
Sundgren et al.

(10) Patent No.: US 10,181,547 B2
(45) Date of Patent: Jan. 15, 2019

(54) OPTOELECTRONIC SEMICONDUCTOR CHIP AND METHOD FOR PRODUCING OPTOELECTRONIC SEMICONDUCTOR CHIPS

(71) Applicant: OSRAM Opto Semiconductors GmbH, Regensburg (DE)

(72) Inventors: Petrus Sundgren, Regensburg (DE); Markus Broell, Freising (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 32 days.

(21) Appl. No.: 14/442,394

(22) PCT Filed: Nov. 4, 2013

(86) PCT No.: PCT/EP2013/072939
§ 371 (c)(1),
(2) Date: May 12, 2015

(87) PCT Pub. No.: WO2014/072254
PCT Pub. Date: May 15, 2014

(65) Prior Publication Data
US 2016/0276534 A1  Sep. 22, 2016

(30) Foreign Application Priority Data

Nov. 12, 2012  (DE) .................... 10 2012 110 836

(51) Int. Cl.
*H01L 33/00* (2010.01)
*H01L 21/00* (2006.01)
(Continued)

(52) U.S. Cl.
CPC ........ *H01L 33/14* (2013.01); *H01L 31/02327* (2013.01); *H01L 31/03042* (2013.01);
(Continued)

(58) Field of Classification Search
CPC ..................................................... B82Y 20/00
(Continued)

(56) References Cited

U.S. PATENT DOCUMENTS 4,730,328 A * 3/1988 Miyauchi .................. H01S 5/24
372/46.01
5,932,896 A * 8/1999 Sugiura .................. B82Y 20/00
257/102

(Continued)

FOREIGN PATENT DOCUMENTS

EP  2287923 A1  2/2011

*Primary Examiner* — Igwe U Anya
(74) *Attorney, Agent, or Firm* — McDermott Will & Emery LLP

(57) ABSTRACT

An optoelectronic semiconductor chip (1) is provided which has a semiconductor body comprising a semiconductor layer sequence (2) with an active region (20) provided for generating and/or receiving radiation, a first semiconductor region (21) of a first conduction type, a second semiconductor region (22) of a second conduction type and a cover layer (25). The active region (20) is arranged between the first semiconductor region (21) and the second semiconductor region (22) and comprises a contact layer (210) on the side remote from the active region. The cover layer (25) is arranged on the side of the first semiconductor region (21) remote from the active region (20) and comprises at least one cut-out (27), in which the contact layer (210) adjoins the first connection layer (3). The cover layer is of the second conduction type. Furthermore, a method is provided for producing optoelectronic semiconductor chips.

18 Claims, 4 Drawing Sheets

(51) Int. Cl.
*H01L 33/14* (2010.01)
*H01L 33/40* (2010.01)
*H01L 31/0232* (2014.01)
*H01L 31/0304* (2006.01)
*H01L 31/18* (2006.01)
*H01L 33/30* (2010.01)
*H01L 33/38* (2010.01)
*H01L 33/32* (2010.01)

(52) U.S. Cl.
CPC ........ *H01L 31/186* (2013.01); *H01L 31/1852* (2013.01); *H01L 33/0066* (2013.01); *H01L 33/0095* (2013.01); *H01L 33/305* (2013.01); *H01L 33/40* (2013.01); *H01L 33/405* (2013.01); *H01L 33/0079* (2013.01); *H01L 33/32* (2013.01); *H01L 33/387* (2013.01); *H01L 2933/0016* (2013.01)

(58) Field of Classification Search
USPC .......................................................... 257/98
See application file for complete search history.

(56) References Cited

U.S. PATENT DOCUMENTS

| | | | |
|---|---|---|---|
| 5,987,048 A * | 11/1999 | Ishikawa | B82Y 20/00 257/30 |
| 7,192,797 B2 * | 3/2007 | Tu | H01L 33/385 257/79 |
| 2001/0050530 A1 | 12/2001 | Murakami et al. | |
| 2002/0020847 A1 | 2/2002 | Horie et al. | |
| 2003/0025123 A1 * | 2/2003 | Onishi | B82Y 20/00 257/102 |
| 2003/0209722 A1 * | 11/2003 | Hatakoshi | H01L 33/20 257/98 |
| 2004/0156408 A1 * | 8/2004 | Tanaka | B82Y 20/00 372/45.01 |
| 2005/0175053 A1 * | 8/2005 | Kimura | H01S 5/02272 372/50.12 |
| 2005/0201440 A1 * | 9/2005 | Asano | B82Y 20/00 372/43.01 |
| 2005/0280022 A1 * | 12/2005 | Ueda | B82Y 20/00 257/103 |
| 2006/0011946 A1 * | 1/2006 | Toda | H01S 5/32341 257/202 |
| 2007/0266932 A1 * | 11/2007 | Hiramatsu | C23C 16/4584 117/88 |
| 2010/0019268 A1 | 1/2010 | Illek | |
| 2010/0032701 A1 | 2/2010 | Fudeta | |
| 2011/0261849 A1 * | 10/2011 | Shinagawa | H01L 33/007 372/45.01 |
| 2011/0291145 A1 * | 12/2011 | Han | H01L 33/0079 257/98 |
| 2012/0273793 A1 * | 11/2012 | Nishikawa | H01L 33/14 257/76 |
| 2013/0264596 A1 | 10/2013 | Schmid et al. | |
| 2013/0292718 A1 * | 11/2013 | Chu | H01L 27/153 257/93 |
| 2013/0313594 A1 * | 11/2013 | Han | H01L 33/62 257/98 |
| 2014/0227813 A1 * | 8/2014 | Yoneda | H01L 33/0095 438/33 |

\* cited by examiner

OPTOELECTRONIC SEMICONDUCTOR CHIP AND METHOD FOR PRODUCING OPTOELECTRONIC SEMICONDUCTOR CHIPS

The present application relates to an optoelectronic semiconductor chip and to a method for producing optoelectronic semiconductor chips.

In optoelectronic semiconductor chips such as for example light-emitting diodes, as low as possible a contact resistance between metallic contacts for external contacting and the semiconductor material is very important for semiconductor chip efficiency. Often highly doped semiconductor contact layers with a comparatively small band gap are distinguished by low contact resistance. On the other hand, however, such a layer may absorb radiation generated in the LED chip due to the small band gap, so reducing the efficiency of the semiconductor chip. To reduce absorption, such contact layers may be formed with a thickness of just a few nanometres. Such layers are however often sensitive to moisture and chemical and/or physical conditions which typically occur during manufacture of the semiconductor chip.

One object is to provide a semiconductor chip which is distinguished by low contact resistance at the same time as low radiation absorption. Furthermore, it is intended to provide a method with which such semiconductor chips may be efficiently and reliably produced.

This object is achieved by a semiconductor chip or a method according to the independent claims. Configurations and further developments constitute the subject matter of the dependent claims.

According to one embodiment, an optoelectronic semiconductor chip comprises a semiconductor body which comprises a semiconductor layer sequence with an active region provided for generating and/or receiving radiation, a first semiconductor region of a first conduction type, a second semiconductor region of a second conduction type different from the first conduction type and a cover layer. The active region is arranged between the first semiconductor region and the second semiconductor region. The first semiconductor region comprises a contact layer on the side remote from the active region. The cover layer is arranged on the side of the first semiconductor region remote from the active region and preferably adjoins the contact layer. In particular, the cover layer comprises at least one cut-out, in which the contact layer adjoins the first connection layer. The cover layer is of the second conduction type.

The contact layer and the cover layer are thus different from one another with regard to conduction type. In particular, the contact layer may be p-conductive and the cover layer n-conductive or vice versa.

It has been demonstrated that such a cover layer with opposite doping to the contact layer allows efficient protection of the contact layer to be achieved.

The injection of charge carriers into the active region in the case of a radiation emitter or charge carrier removal from the active region in the case of a radiation receiver takes place via the first connection layer adjoining the contact layer and formed outside the semiconductor body. The contact resistance relative to the semiconductor body is thus determined by the contact layer. In contrast hereto, the cover layer serves not in electrical contacting of the semiconductor chip, but rather in protection of the contact layer.

The semiconductor chip may also comprise two or more active regions. In this case, the first semiconductor region is appropriately arranged between the cover layer and the active region closest to the cover layer.

The cover layer preferably has a larger band gap than the contact layer. The risk of radiation absorption in the cover layer may thus also be prevented or at least reduced even with a comparatively large cover layer thickness. In particular, the cover layer may be at least twice as thick, preferably at least five times as thick as the contact layer.

In a preferred configuration, the cover layer is based on arsenide or phosphide compound semiconductor material.

"Based on phosphide compound semiconductor material" means in this context that a layer or at least a part thereof predominantly, i.e. in a proportion of at least 51%, contains phosphorus as its group V element (i.e. as its element of the main group V). Preferably, the material has the material composition $In_y Ga_{1-x-y} Al_x P$, wherein $0 \leq x \leq 1$, $0 \leq y \leq 1$ and $x+y \leq 1$.

"Based on arsenide compound semiconductor material" accordingly means that a layer or at least a part thereof predominantly, i.e. in a proportion of at least 51%, contains arsenic. Preferably, the material has the material composition $In_y Ga_{1-x-y} Al_x As$, wherein $0 \leq x \leq 1$, $0 \leq y \leq 1$ and $x+y \leq 1$.

The stated materials do not necessarily have to comprise a mathematically exact composition according to the above formulae. Instead, they may comprise one or more dopants and additional constituents. For simplicity's sake, however, the above formula includes only the fundamental constituents of the crystal lattice, even if these may in part be replaced by small quantities of further substances.

In particular, such a cover layer is suitable in connection with an active region which is likewise based on arsenide or phosphide compound semiconductor material. The cover layer and the active region may, but do not necessarily have to be based on the same semiconductor material system. For example, the cover layer may be based on phosphide compound semiconductor material and the active region on arsenide compound semiconductor material.

It has surprisingly been found that doping the cover layer with a conduction type different from the contact layer results in improved characteristics of the semiconductor chip, although the cover layer does not itself serve in electrical contacting.

It has in particular been shown that n-doped semiconductor material for the cover layer comprises hydrogen-blocking characteristics. In this way it may be ensured that during production of the semiconductor chip less hydrogen enters the semiconductor material of the semiconductor layer sequence. This brings about improved ageing behaviour.

In a preferred configuration, the cover layer is doped with Te and/or Si. Compared with p-dopants such as magnesium or zinc, tellurium and silicon have less of a tendency to diffuse into adjoining arsenide or phosphide compound semiconductor material. This leads to improved controllability of the production process.

In a preferred configuration, the cover layer is based on $In_y Ga_{1-x-y} Al_x P$ with $0 \leq x \leq 1$, $0 \leq y \leq 1$ and $x+y \leq 1$. Particularly preferably, the cover layer has a gallium content of at most 0.1, i.e. $x+y \geq 0.9$ applies. The lower the gallium content, the higher the aluminium content may be for the same indium content. In this way, the band gap of the cover layer may be increased further.

In a preferred configuration, the first connection layer for the radiation to be generated or received by the active region is reflective. Preferably, the reflectivity for radiation amounts to at least 60%, particularly preferably at least 70%.

The higher the reflectivity, the smaller the proportion of radiation which may be absorbed by the first connection layer.

The first connection layer may cover the cover layer at least in places. Furthermore, an interlayer which is in particular radiation-transmissive may be arranged between the connection layer and the cover layer. The interlayer may be a dielectric layer. The interlayer may contain for example a dielectric oxide or nitride. Alternatively, the interlayer may also be electrically conductive. For example, the interlayer may contain a TCO (transparent conductive oxide) material, for instance indium-tin oxide (ITO), tin oxide (SnO) or zinc oxide (ZnO).

In particular, the first connection layer may be arranged over the entire surface or substantially the entire surface, i.e. over at least 90% of the surface, of the cover layer. Alternatively, however, it is also feasible for the first connection layer to be arranged predominantly or exclusively in the region of the cut-outs.

In a preferred configuration, the semiconductor chip takes the form of a thin-film semiconductor chip. In a thin-film semiconductor chip a growth substrate for preferably epitaxial deposition of the semiconductor layers of the semiconductor layer sequence of the semiconductor body is removed. To stabilise the semiconductor body mechanically, the semiconductor body is preferably arranged on a carrier other than the growth substrate. A mirror layer is preferably formed between the semiconductor body and the carrier. The mirror layer may be formed in particular by means of the first connection layer.

In a method for producing a plurality of semiconductor chips, according to one embodiment a semiconductor layer sequence is provided which has an active region provided for generating and/or receiving radiation, a first semiconductor region of a first conduction type, a second semiconductor region of a second conduction type and a cover layer. The first semiconductor region comprises a contact layer on the side remote from the active region. The cover layer is arranged on the side of the first semiconductor region remote from the active region and is of the second conduction type. In the cover layer a plurality of cut-outs is formed. A first connection layer is formed such that the first connection layer adjoins the contact layer in the cut-outs. Singulation into a plurality of semiconductor chips is subsequently performed, wherein each semiconductor chip comprises at least one cut-out. During processing of the semiconductor layer sequence into semiconductor chips, the contact layer is protected by the cover layer. The risk of damage to the contact layer is reduced in this way to the greatest possible extent, such that comparatively thin layer thicknesses may be used for the contact layer.

In a variant configuration the semiconductor layer sequence provided has a further cover layer on the side of the cover layer remote from the active region. The further cover layer is preferably removed completely prior to formation of the first connection layer, in particular prior to formation of the plurality of cut-outs in the cover layer. Removal preferably proceeds by means of a wet chemical or dry chemical process. Particularly preferably, the further cover layer and the cover layer are adapted with regard to material in such a way to the etching process that high etching selectivity arises. In other words, material removal during the etching step is stopped or at least greatly slowed down when the further cover layer has been removed and the underlying cover layer has been reached.

Preferably, the further cover layer is based on arsenide compound semiconductor material and the cover layer on phosphide compound semiconductor material. High etching selectivity is thus easily achievable.

Unlike the cover layer, the further cover layer may also have a comparatively small band gap, since the further cover layer is completely removed and is thus no longer present in the finished semiconductor chip.

In a preferred configuration, the semiconductor layer sequence is applied to a carrier prior to singulation. In particular, the carrier is severed on singulation into semiconductor chips. The carrier serves in mechanical stabilisation of the semiconductor layer sequence, such that the growth substrate is no longer necessary for the semiconductor layer sequence. The growth substrate may therefore be removed before or after application onto the carrier, for example mechanically, for instance by means of grinding, lapping or polishing, and/or chemically, for instance by means of wet chemical or dry chemical etching or by means of a laser detachment method (laser lift-off, LLO).

The above-described method is particularly suitable for producing a semiconductor chip described above. Features described in connection with the method may therefore also be used for the semiconductor chip and vice versa.

Further features, configurations and convenient aspects are revealed by the following description of the exemplary embodiments in conjunction with the figures, in which:

FIGS. 1 and 2 each show an exemplary embodiment of a semiconductor chip in schematic sectional view;

Identical, similar or identically acting elements are provided with the same reference numerals in the figures.

The figures are in each case schematic representations and are therefore not necessarily true to scale. Rather, comparatively small elements and in particular layer thicknesses may be illustrated on an exaggeratedly large scale for clarification.

Figure 1:
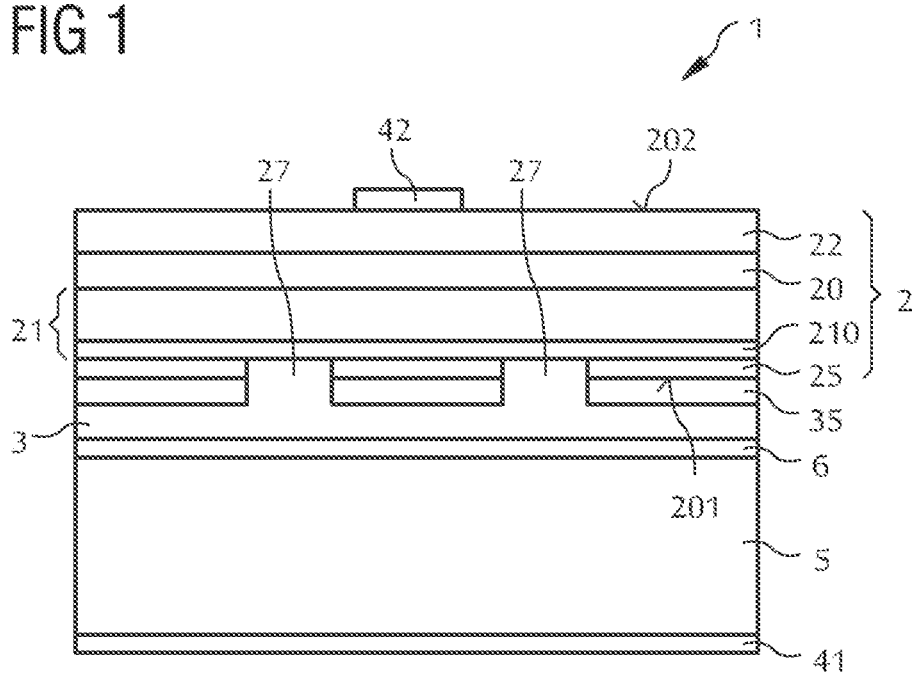

A first exemplary embodiment of an optoelectronic semiconductor chip is illustrated schematically in sectional view in FIG. 1. In this exemplary embodiment the semiconductor chip 1 takes the form by way of example of a luminescent diode semiconductor chip, in particular of an LED semiconductor chip. The semiconductor chip may however also take the form of a laser diode semiconductor chip or of a radiation receiver.

The semiconductor chip 1 comprises a semiconductor body with a semiconductor layer sequence 2. The semiconductor layer sequence comprises an active region 20 provided for generating radiation, which is arranged between a first semiconductor region 21 of a first conduction type and a second semiconductor region 22 of a second conduction type. In the exemplary embodiment the first semiconductor region 21 is p-conductive and second semiconductor region 22 is n-conductive. The first semiconductor region 21 comprises a contact layer 210 on a side remote from the active region 20. The contact layer is preferably highly doped, for instance with a doping concentration of at least $1 \times 10^{17}$ cm$^{-3}$, particularly preferably of at least $1 \times 10^{18}$ cm$^{-3}$.

On the side of the first semiconductor region 21 remote from the active region 20 a cover layer 25 is formed. The cover layer adjoins the contact layer 210. The cover layer has the same conduction type as the second semiconductor region 22.

In the vertical direction, i.e. in a direction extending perpendicular to a main plane of extension of the semiconductor layers of the semiconductor layer sequence 2, the semiconductor body 2 extends between a first major face 201 and a second major face 202. The cover layer 25 forms the first major face 201.

The semiconductor body 2 is arranged on a carrier 5 and connected mechanically stably and electrically conductively thereto by means of a bonding layer 6. Examples of layers suitable for the bonding layer 6 are an electrically conductive adhesive layer or a solder layer.

A first connection layer 3 is formed between the semiconductor body 2 and the carrier 5.

The cover layer 25 comprises a plurality of cut-outs. In the cut-outs the first connection layer 3 adjoins the contact layer 210.

A first contact surface 41 is formed on the side of the carrier 5 remote from the semiconductor body 2. The first contact surface 41 is connected electrically conductively with the contact layer 210 via the carrier, the bonding layer and the first connection layer 3.

On the side of the semiconductor body 2 remote from the carrier 5, a second contact surface 42 is arranged. When the semiconductor chip is in operation, through application of an external electrical voltage between the first contact surface 41 and the second contact surface 42 charge carriers may be injected into the semiconductor chip 1 and recombine with emission of radiation in the active region 20.

The first connection layer 3 extends over the entire surface of the first major face 201. The connection layer 3 or at least a sub-layer thereof preferably contains a metal or a metal alloy. The first connection layer preferably has a reflectivity of at least 60%, particularly preferably of at least 70% for the radiation generated in the active region. For example, aluminium, silver, rhodium, palladium and iridium are distinguished by high reflectivity in the visible spectral range. In the red and infrared spectral ranges, for example, gold has a high reflectivity.

In the vertical direction between the cover layer 25 and the connection layer 3, a dielectric layer is formed as an interlayer 35. The interlayer 35 is appropriately configured to be transmissive for the radiation generated in the active region 20 and moreover has a lower refractive index than the compound semiconductor material, adjacent at the first major face 201, of the semiconductor body 2. The greater the refractive index difference, the greater the proportion of the radiation generated in the active region 20 and totally reflected at the boundary surface between the semiconductor body 2 and the interlayer 35. Only radiation which impinges on the first major face 201 at an angle to the normal which is smaller than the angle for total reflection passes through the interlayer 35 and is reflected at the first connection layer 3. The dielectric layer may for example contain an oxide, for instance silicon oxide, a nitride, for example silicon nitride, or an oxynitride, for example silicon oxynitride or consist of such a material. In contrast thereto, the interlayer 35 may also contain a TCO material, for instance ITO, ZnO or SnO. Unlike in the exemplary embodiment shown, it is however also possible to dispense with the interlayer 35.

In the case of an active region 20 based on arsenide or phosphide compound semiconductor material, the cover layer 25 may contain arsenide or phosphide material. The cover layer is preferably n-conductively doped with tellurium or silicon. A different dopant may also be used, however.

Charge carrier injection into the semiconductor body 2 proceeds via the cut-outs 27 in the cover layer 25. The material for the cover layer 25 may therefore be selected independently of the contact resistance relative to the first connection layer 3. Preferably, the contact layer 210 comprises an arsenide or phosphide compound semiconductor material which has a smaller band gap than the cover layer 25. A low contact resistance may thus be achieved in a simplified manner. Furthermore, the contact layer 210 may be comparatively thin, for example with a thickness of at most 20 nm, since it is protected by the cover layer 25. The cover layer is preferably at least twice as thick, particularly preferably at least five times as thick, as the contact layer.

The n-conductive doping of the cover layer makes it possible to prevent hydrogen from penetrating into the semiconductor chip on production of the semiconductor chips, for example when the interlayer 35 is formed using a PECVD method.

Instead of p-doping of the cover layer 25, n-doping has the further advantage that n-dopants such as tellurium or silicon have less of a tendency to diffuse into arsenide or phosphide compound semiconductor material. It has additionally been found that tellurium is particularly suitable, because with tellurium particularly smooth surfaces can be achieved during epitaxial deposition of the semiconductor material. In this way, smooth boundary surfaces with the interlayer 35 or, in the absence of the interlayer, with the first connection layer 3 may be achieved in a simplified manner. This improves reflectivity at this boundary surface.

Furthermore, the n-conductive cover layer forms a pn-junction with the p-conductive contact layer. This pn-junction constitutes a charge carrier barrier layer, such that charge carriers are injected into the semiconductor body 2 only at points at which the connection layer 3 adjoins the contact layer 210. In other words, it is possible to adjust the points at which charge carrier injection takes place via positioning of the cut-outs 27. Even in the absence of the interlayer 35 or in the case of an electrically conductive interlayer, it is thus ensured that no charge carrier injection into the semiconductor body takes place to the side of the cut-outs 27.

For a cover layer 25 based on phosphide compound semiconductor material, an InGaAlP layer with a gallium content of at most 10% is particularly suitable. In particular, the layer may also contain no gallium. Such a cover layer has proven favourable both for a carbon-doped contact layer 210 of GaAs and for a magnesium-doped contact layer based on InGaAlP.

In contrast thereto, however, a cover layer based on arsenide compound semiconductor material may also be used. For example, an AlGaAs cover layer doped with silicon has also proven suitable for a contact layer based on InGaP doped with zinc.

Although the cover layer 25 is itself thus not provided for charge carrier transport, the efficiency of the semiconductor chips may be improved by an n-doped cover layer in the case of a p-doped contact layer.

Unlike in the exemplary embodiment shown, the semiconductor layers may also be of inverted configuration with regard to their conduction type. This means that the p-conductively doped semiconductor layers may be n-conductive and vice versa.

Figure 2:
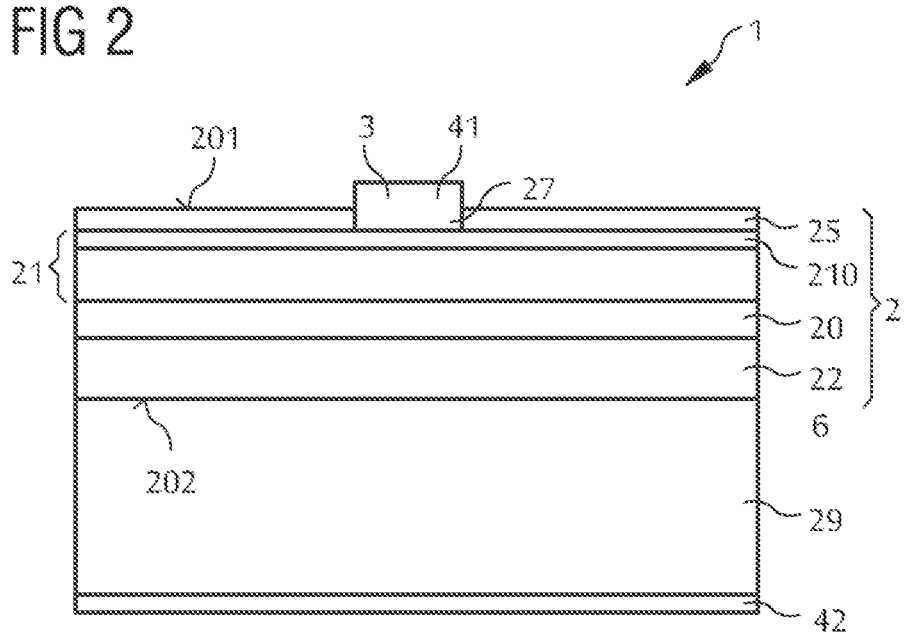

A second exemplary embodiment of a semiconductor chip is shown in FIG. 2. This second exemplary embodiment substantially corresponds to the first exemplary embodiment described in connection with FIG. 1. In contrast thereto, the semiconductor layer sequence 2 is arranged on a growth substrate 29. The semiconductor chip thus does not take the form of a thin-film semiconductor chip. The first semiconductor region 21 is arranged on the side of the active region 20 remote from the growth substrate 29. In this case, radiation outcoupling proceeds through the first major face 201 of the semiconductor body with the semiconductor layer sequence 2. Furthermore, the cover layer 25 has just one cut-out 27, in which the first connection layer 3 is arranged. The first connection layer forms the first contact surface 41 for external electrical contacting. In the exemplary embodiment shown, the first connection layer 3 is formed solely within the cut-out 27. In contrast thereto, however, the first connection layer may also cover the cover layer 25 in places.

It goes without saying that the cover layer 25 may also, as described in relation to FIG. 1, comprise a plurality of cut-outs 27, in which the first connection layer 3 in each case adjoins the contact layer 210.

An exemplary embodiment of a method for producing semiconductor chips is shown in FIGS. 3A to 3F by way of intermediate steps. For simplified representation, in each case a portion is shown in the figures which results in one semiconductor chip during production. By way of example, the finished semiconductor chip is configured as described in connection with FIG. 1.

Figure 3A:
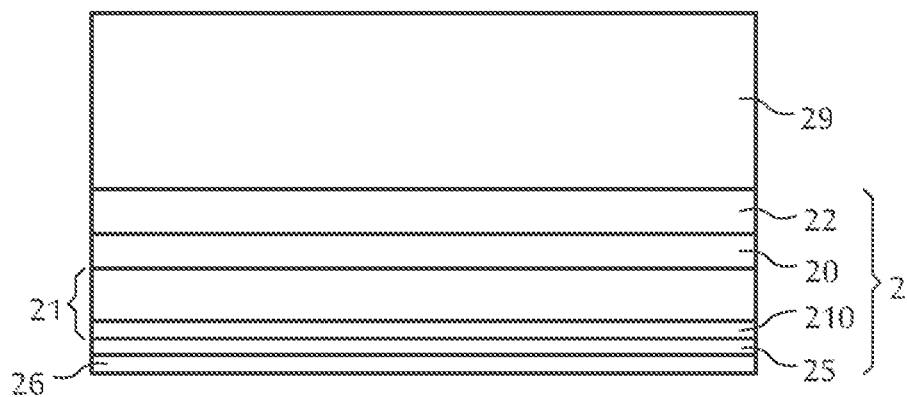
FIGS. 3A to 3F show an exemplary embodiment of a method for producing semiconductor chips by means of intermediate steps shown schematically in sectional view.

As shown in FIG. 3A, a semiconductor layer sequence 2 is deposited epitaxially on a growth substrate 29, for example by means of MOCVD or MBE. The semiconductor layer sequence 2 comprises a second semiconductor region 22, an active region 20, a first semiconductor region 21 with a contact layer 210, a cover layer 25 and a further cover layer 26.

The cover layer 25 may be configured as described in connection with FIGS. 1 and 2 and is in particular different with regard to conduction type from the first semiconductor region 21 with the contact layer 210.

The further cover layer 26 is preferably based on an arsenide compound semiconductor material, for example AlGaAs. Epitaxial deposition thus ends with a layer based on arsenide compound semiconductor material.

During epitaxial deposition, the p-doped first semiconductor region 21, which is doped for example with magnesium or zinc, is completely covered by n-conductive material of the cover layer and optionally the further cover layer. For subsequent epitaxy cycles for producing further semiconductor layer sequences, coverage with n-conductive material, doped for example with tellurium or silicon, allows suppression of any negative influence from the p-dopants such as magnesium, so resulting in fewer crystal defects. This influence on subsequent epitaxy cycles is also known as memory effect.

Figure 3B:
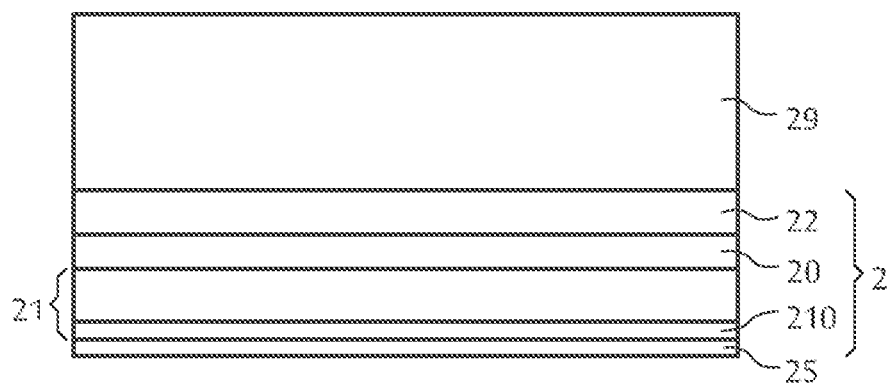

When processing the semiconductor layer sequence 2 into semiconductor chips, this further cover layer may be removed, as shown in FIG. 3B. Preferably, the cover layer 25 is based on a phosphide compound semiconductor material, such that the further cover layer 26 may be simply removed with selective etching without impairing the cover layer 25.

Deposition of the further cover layer 26 may however also be dispensed with. In this case, the process step described in connection with FIG. 3B may be omitted.

Figure 3C:
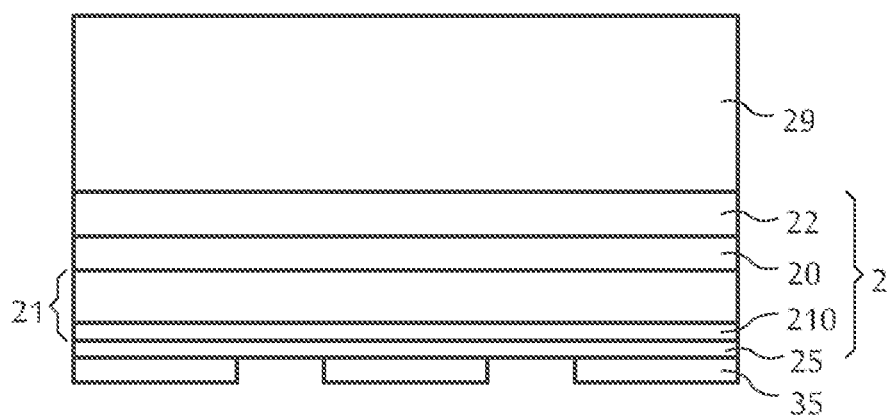

An interlayer 35 is applied to the cover layer 25 and photolithographically patterned (FIG. 3C). In the patterned regions the cover layer 25 is exposed.

Figure 3D:
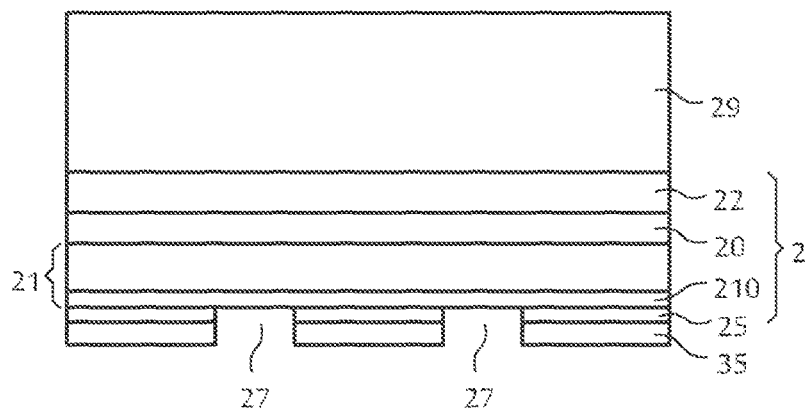

The interlayer 35 serves as a mask for patterning the cover layer 25, such that cut-outs 27 are formed in the cover layer in which the contact layer 210 is exposed (FIG. 3D).

Figure 3E:
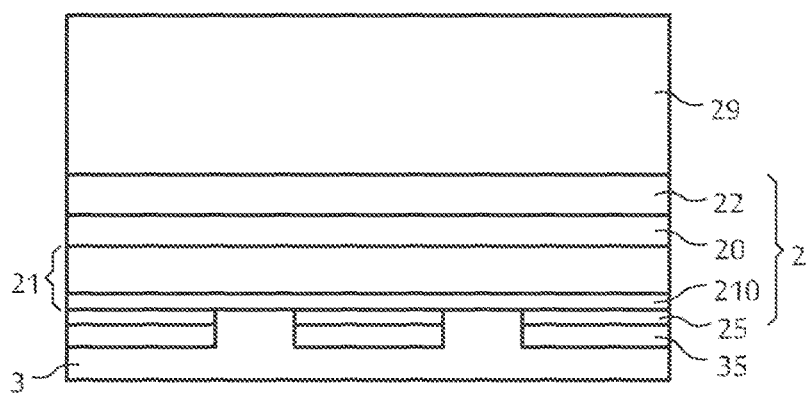

Then the first connection layer 3 is formed on the interlayer 35, such that it adjoins the contact layer 210 in the region of the cut-outs 27 (FIG. 3E). The semiconductor layer sequence 2 is secured by means of a bonding layer 6, for instance a solder layer or an electrically conductive adhesive layer, to a carrier 5. The carrier 5 serves in mechanical stabilisation of the semiconductor layer sequence 2, such that the growth substrate 29 is no longer necessary for this purpose and may be removed. Removal may proceed for example chemically, for instance by means of wet chemical or dry chemical etching, and/or mechanically, for instance by means of grinding, lapping or polishing, or by means of a laser detachment method.

Figure 3F:
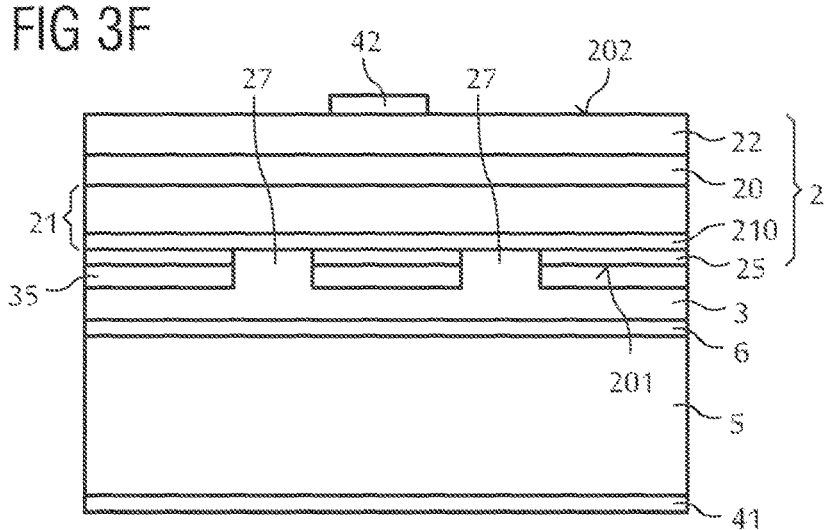

For singulation into semiconductor chips, the carrier 5 with the semiconductor layer sequence 2 arranged thereon is severed. The singulated semiconductor chip is shown in FIG. 3F.

Figure 4A:
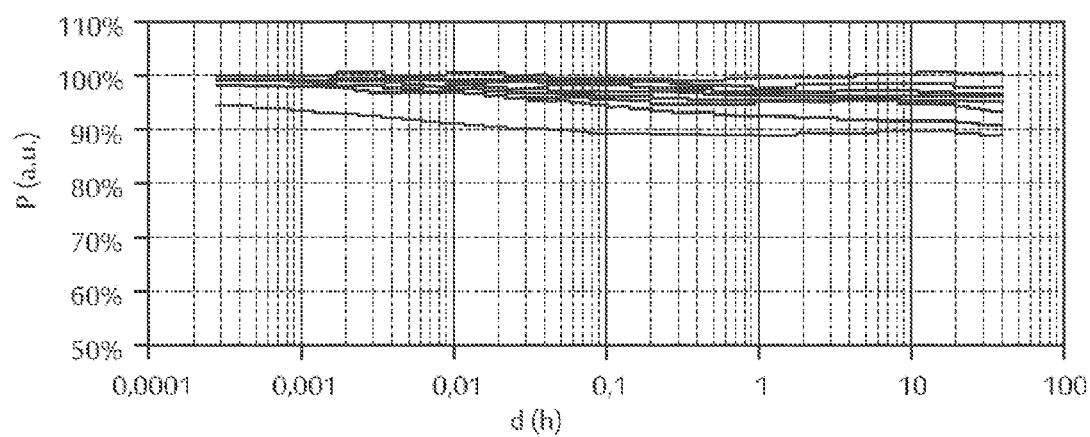
FIGS. 4A and 4B show measurement results from ageing tests for semiconductor chips with the described cover layer (FIG. 4A) and for comparative samples without a cover layer doped in this way (FIG. 4B).
Figure 4B:
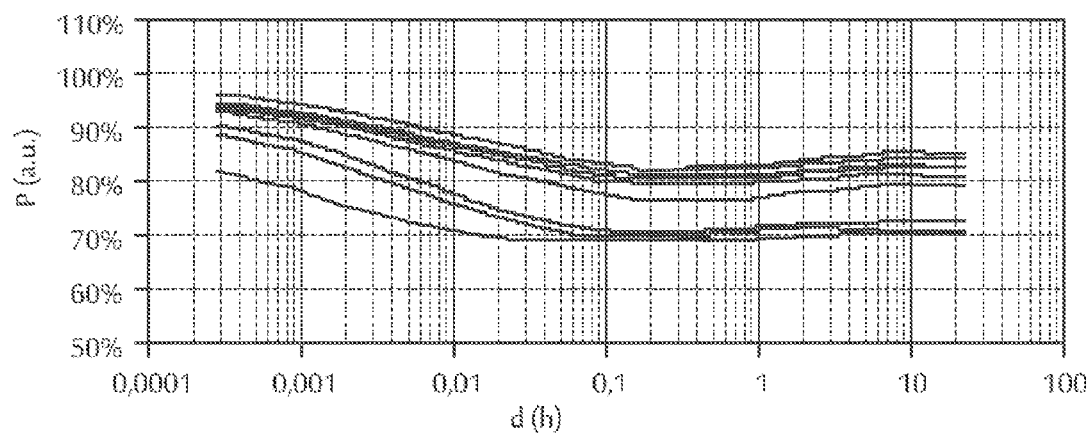

FIG. 4A shows results of ageing measurements, wherein the cover layer 25 is n-doped. FIG. 4B shows results of comparative measurements, in which the cover layer is nominally undoped. The profile of the radiant power P is shown in each case in arbitrary units as a function of service life d in hours at an operating current of 10 mA. For the measurements the semiconductor layer sequence was in each case patterned with a 300 μm grid.

The measurements prove that n-doping of the cover layer together with a p-doped contact layer leads to improved ageing behaviour of the semiconductor chips. Measurements at different operating currents have shown that although this effect is greater at low operating currents, it is still also clearly noticeable at high operating currents.

This patent application claims priority from German patent application 10 2012 110 836.6, the disclosure content of which is hereby included by reference.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The invention claimed is:

1. A method for producing a plurality of semiconductor chips, comprising the steps of:
    a) providing a semiconductor layer sequence with an active region provided for generating and/or receiving radiation, a first semiconductor region of a first conduction type, a second semiconductor region of a second conduction type different from the first conduction type and a cover layer, wherein the first semiconductor region comprises a contact layer on the side remote from the active region, the cover layer is arranged on the side of the first semiconductor region remote from the active region and the cover layer is of the second conduction type;
    b) forming a plurality of cut-outs in the cover layer;
    c) forming a first connection layer, such that the first connection layer directly adjoins the contact layer in the cut-outs; and
    d) singulation into a plurality of semiconductor chips, wherein each semiconductor chip comprises at least one cut-out,
    wherein a radiation-transmissive interlayer is arranged between the first connection layer and the cover layer, the interlayer being a dielectric layer or comprising a TCO material, and
    wherein the interlayer has a lower refractive index than the material of a semiconductor body adjacent to the interlayer.

2. The method according to claim 1, wherein the semiconductor layer sequence in step a) comprises a further cover layer on the side of the cover layer remote from the active region.

3. The method according to claim 2, wherein the further cover layer is removed completely prior to step c).

4. The method according to claim 2, wherein the further cover layer is based on arsenide compound semiconductor material and the cover layer is based on phosphide compound semiconductor material.

5. The method according to claim 1, wherein the semiconductor layer sequence is applied to a carrier prior to step d) and the carrier is severed in step d).

6. An optoelectronic semiconductor chip with a semiconductor body, which comprises a semiconductor layer sequence with an active region provided for generating and/or receiving radiation, a first semiconductor region of a first conduction type, a second semiconductor region of a second conduction type different from the first conduction type and a cover layer, wherein
the active region is arranged between the first semiconductor region and the second semiconductor region;
the first semiconductor region comprises a contact layer on the side remote from the active region;
the cover layer is arranged on the side of the first semiconductor region remote from the active region;
the cover layer comprises at least one cut-out, in which the contact layer directly adjoins a first connection layer;
the cover layer is of the second conduction type;
the first connection layer covers at least a portion of the cover layer; and
a radiation-transmissive interlayer is arranged between the first connection layer and the cover layer, the interlayer being a dielectric layer or comprising a TCO material,
wherein the interlayer has a lower refractive index than the material of the semiconductor body adjacent to the interlayer.

7. The optoelectronic semiconductor chip according to claim 6, wherein the cover layer is n-conductive.

8. The optoelectronic semiconductor chip according to claim 6, wherein the cover layer is doped with Te and/or Si.

9. The optoelectronic semiconductor chip according to claim 6, wherein the cover layer is based on arsenide or on phosphide compound semiconductor material.

10. The optoelectronic semiconductor chip according to claim 6, wherein the cover layer is based on $In_y GA_{1-x-y} Al_x P$ with $0 \leq x \leq 1$, $0 \leq y \leq 1$ and $x+y \leq 1$.

11. The optoelectronic semiconductor chip according to claim 10, wherein the cover layer has a gallium content of at most 0.1.

12. The optoelectronic semiconductor chip according to claim 6, wherein the first connection layer is reflective for the radiation to be generated or received by the active region.

13. The optoelectronic semiconductor chip according to claim 6, wherein the first connection layer covers at least a portion of the cover layer and a radiation-transmissive interlayer is arranged between the connection layer and the cover layer.

14. The optoelectronic semiconductor chip according to claim 6, wherein the semiconductor chip takes the form of a thin-film semiconductor chip.

15. The optoelectronic semiconductor chip according to claim 6, wherein the cover layer is doped with Te.

16. The optoelectronic semiconductor chip according to claim 6, wherein the first connection layer is a metal layer.

17. The optoelectronic semiconductor chip according to claim 6, wherein the interlayer is electrically conductive and comprises the TCO material.

18. The optoelectronic semiconductor chip according to claim 6, wherein the interlayer directly adjoins the cover layer.

* * * * *